United States Patent
Dai

(10) Patent No.: US 11,291,126 B2
(45) Date of Patent: Mar. 29, 2022

(54) CIRCUIT BOARD AND METHOD OF MANUFACTURING CIRCUIT BOARD

(71) Applicants: HongQiSheng Precision Electronics (QinHuangDao) Co.,Ltd., Qinhuangdao (CN); Avary Holding (Shenzhen) Co., Limited., Shenzhen (CN)

(72) Inventor: Jun Dai, Qinhuangdao (CN)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 17/022,385

(22) Filed: Sep. 16, 2020

(65) Prior Publication Data

US 2022/0030724 A1 Jan. 27, 2022

(30) Foreign Application Priority Data

Jul. 23, 2020 (CN) .......................... 202010719860.6

(51) Int. Cl.
| | |
|---|---|
| H05K 1/00 | (2006.01) |
| H05K 1/02 | (2006.01) |
| H05K 1/09 | (2006.01) |
| H05K 1/11 | (2006.01) |
| H05K 1/18 | (2006.01) |
| H05K 3/02 | (2006.01) |
| H05K 3/06 | (2006.01) |

(Continued)

(52) U.S. Cl.
CPC ........... *H05K 3/467* (2013.01); *H05K 1/0298* (2013.01); *H05K 1/0313* (2013.01); *H05K 3/0023* (2013.01); *H05K 3/188* (2013.01); *H05K 2203/06* (2013.01); *H05K 2203/0723* (2013.01)

(58) Field of Classification Search
CPC .. H05K 1/00; H05K 1/02; H05K 1/09; H05K 1/11; H05K 1/18; H05K 1/115; H05K 1/118; H05K 1/144; H05K 1/181; H05K 3/02; H05K 3/06; H05K 3/28; H05K 3/46; H05K 3/188; H05K 3/205; H05K 3/243; H05K 3/423; H05K 3/427; H05K 3/465
USPC ............... 174/255, 250, 257, 262, 264, 549; 361/749, 783
See application file for complete search history.

(56) References Cited

U.S. PATENT DOCUMENTS 6,097,097 A * 8/2000 Hirose ................ H01L 23/5386
257/778
2008/0083983 A1* 4/2008 Jang ........................ H01L 24/11
257/737

(Continued)

*Primary Examiner* — Xiaoliang Chen
(74) *Attorney, Agent, or Firm* — ScienBiziP, P.C.

(57) ABSTRACT

A circuit board includes a substrate, a first circuit layer, a second circuit layer, and a third circuit layer. The substrate includes a base layer, a first metal layer formed on the base layer, and a seed layer formed on the first metal layer. The first circuit layer is located on the substrate and includes the first metal layer and a signal layer formed on a surface of the first metal layer. The second circuit layer is coupled to the first circuit layer and includes the first metal layer, the seed layer, and a connection pillar formed on a surface of the first metal layer and the seed layer. The third circuit layer is coupled to the second circuit layer and includes the seed layer and a coil formed on a surface of the seed layer.

6 Claims, 7 Drawing Sheets

(51) Int. Cl.
*H05K 3/28* (2006.01)
*H05K 3/46* (2006.01)
*H05K 1/03* (2006.01)
*H05K 3/18* (2006.01)
*H05K 3/00* (2006.01)

(56) References Cited

U.S. PATENT DOCUMENTS

| | | | | |
|---|---|---|---|---|
| 2009/0095508 | A1* | 4/2009 | Park | H01L 21/4846 |
| | | | | 174/250 |
| 2010/0013094 | A1* | 1/2010 | Jo | H01L 24/13 |
| | | | | 257/738 |
| 2010/0246152 | A1* | 9/2010 | Lin | H01L 24/02 |
| | | | | 361/783 |
| 2014/0116753 | A1* | 5/2014 | Lee | H05K 1/09 |
| | | | | 174/250 |
| 2016/0086721 | A1* | 3/2016 | Park | H01F 27/2804 |
| | | | | 336/200 |
| 2017/0140866 | A1* | 5/2017 | Hong | H01F 27/292 |
| 2017/0271071 | A1* | 9/2017 | Kim | H01F 41/041 |
| 2018/0027651 | A1* | 1/2018 | Lim | H05K 3/18 |
| | | | | 361/749 |
| 2019/0051446 | A1* | 2/2019 | Park | H01F 41/041 |

* cited by examiner

CIRCUIT BOARD AND METHOD OF MANUFACTURING CIRCUIT BOARD

FIELD

The subject matter herein generally relates to circuit boards, and more particularly to a manufacturing method of manufacturing a circuit board.

BACKGROUND

Cameras are an important micro motor component of electronic devices. At present, a thickness of the micromotor is generally greater than 0.4 mm, and a production process requires separate circuit board and coil production processes, which takes a long time and has low production efficiency.

BRIEF DESCRIPTION OF THE DRAWINGS

Implementations of the present disclosure will now be described, by way of embodiments, with reference to the attached FIGS.

DETAILED DESCRIPTION

Figure 1:
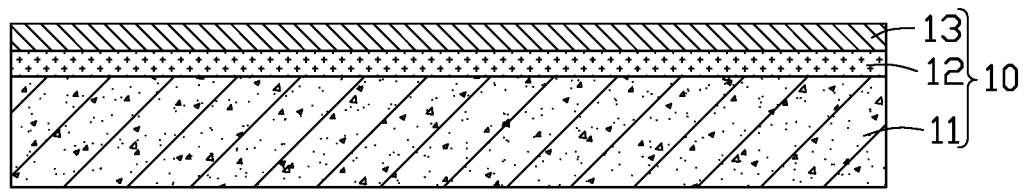
FIG. 1 is a schematic cross-sectional diagram of a substrate according to a first embodiment.

It will be appreciated that for simplicity and clarity of illustration, where appropriate, reference numerals have been repeated among the different FIGS to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or another word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

FIGS. 1-9 show a first embodiment of a manufacturing method of a circuit board including the following steps.

Referring to FIG. 1, a substrate 10 is provided. The substrate 10 includes a flexible insulating base layer 11, a first metal layer 12 formed on a surface of the base layer 11, and a second metal layer 13 formed on a surface of the first metal layer 12.

A material of the base layer 11 can be selected from at least one of polyimide (PI), liquid crystal polymer (LCP), polyethylene terephthalate (PET), and polyethylene naphthalate (PEN).

Materials of the first metal layer 12 and the second metal layer 13 are different. A sheet resistance of the first metal layer 12 is larger than a sheet resistance of the second metal layer 13.

In some embodiments, the material of the first metal layer 12 is a combination of Ni—P or NiCr oxide. A doping content of P and O and a thickness of the metal layer 12 can be used to control the sheet resistance of the first metal layer 12. The material of the second metal layer 13 may be Cu. Due to the difference in sheet resistance between the first metal layer 12 and the second metal layer 13, by controlling the magnitude of a step current, the efficiency of electroplating on the first metal layer 12 and the second metal layer 13 is different, so that the thickness of an electroplating layer can be controlled.

In one embodiment, the thickness of the first metal layer 12 is less than 0.1 μm, and the thickness of the second metal layer 13 is between 0.1 μm and 4 μm.

Figure 2:
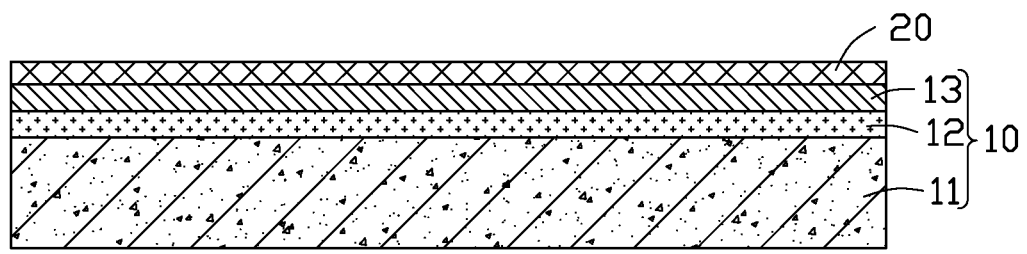
FIG. 2 is a schematic cross-sectional diagram of laminating the substrate shown in FIG. 1.

Referring to FIG. 2, the substrate 10 is laminated by covering a first dry film 20 on the first metal layer 12.

Figure 3:
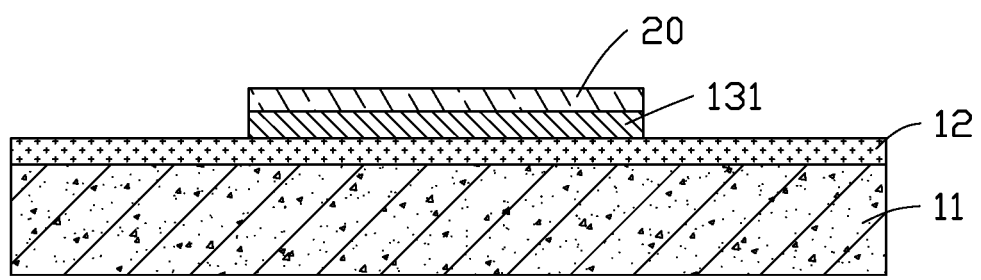
FIG. 3 is a schematic cross-sectional diagram of exposing, developing, and etching the substrate shown in FIG. 2.

Referring to FIG. 3, the substrate 10 is exposed, developed, and etched, and the second metal layer 13 of the substrate 10 is etched to form a seed layer 131.

Specifically, a portion of the first dry film 20 is removed by exposure and development to reveal a portion of the second metal layer 13. Then, the revealed portion of the second metal layer 13 is etched to form the seed layer 131 under the first dry film 20.

Figure 4:
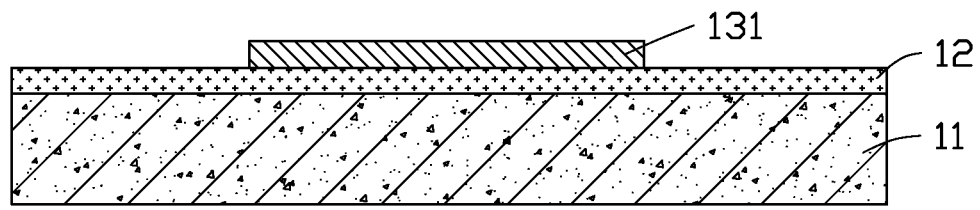
FIG. 4 is a schematic cross-sectional diagram of removing a film from the substrate shown in FIG. 3.

Referring to FIG. 4, a film removal process is performed on the substrate 10 to remove the first dry film 20.

Figure 5:
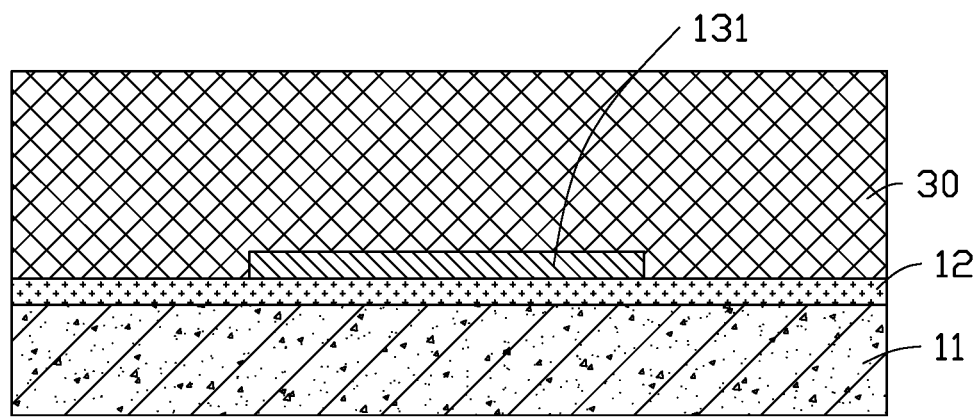
FIG. 5 is a schematic cross-sectional diagram of laminating the substrate shown in FIG. 4.

Referring to FIG. 5, the substrate 10 is laminated, and a second dry film 30 is covered on the first metal layer 12 and the seed layer 131.

Figure 6:
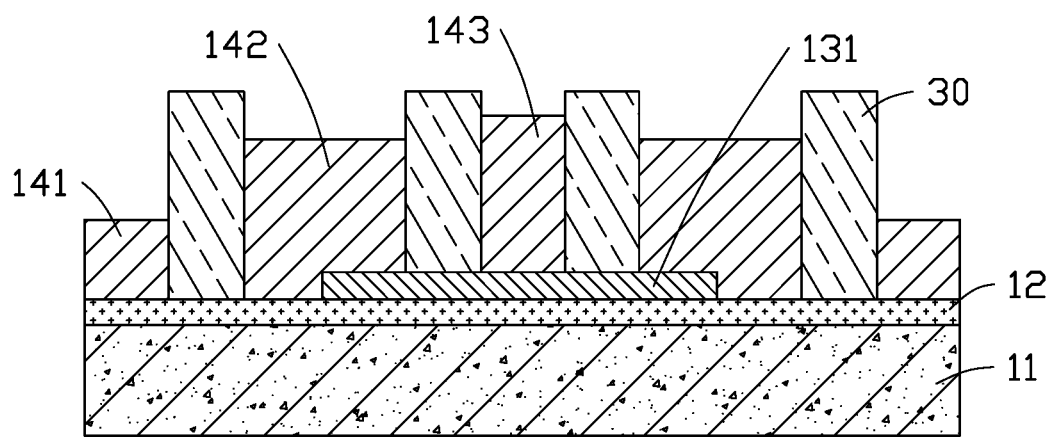
FIG. 6 is a schematic cross-sectional diagram of exposing, developing, and electroplating the substrate shown in FIG. 5.

Referring to FIG. 6, the substrate 10 is exposed, developed, and electroplated to remove a portion of the dry film 30, separately reveal the first metal layer 12, a portion of the first metal layer 12 and the seed layer 131, and the seed layer 131, and form a signal layer 141 on the first metal layer 12, a connection pillar 142 on the portion of the first metal layer 12 and the seed layer 131, and a coil 143 on the seed layer 131. The connection pillar 142 is located between the signal layer 141 and the coil 143.

Specifically, due to the difference in sheet resistance between the first metal layer 12 and the seed layer 131, different electroplating efficiencies on the first metal layer 12 and the seed layer 131 are achieved by controlling the magnitude of the step current. For example, the different electroplating efficiencies can be achieved by first using a small-magnitude current, and then using a large-magnitude current, so that the signal layer 141 formed on the first metal layer 12 has the thinnest copper thickness, the coil 143 on the seed layer 131 has the thickest copper thickness, and the connection pillar 142 on the portion of the first metal layer 12 and the seed layer 131 has an intermediate copper thickness.

Figure 7:
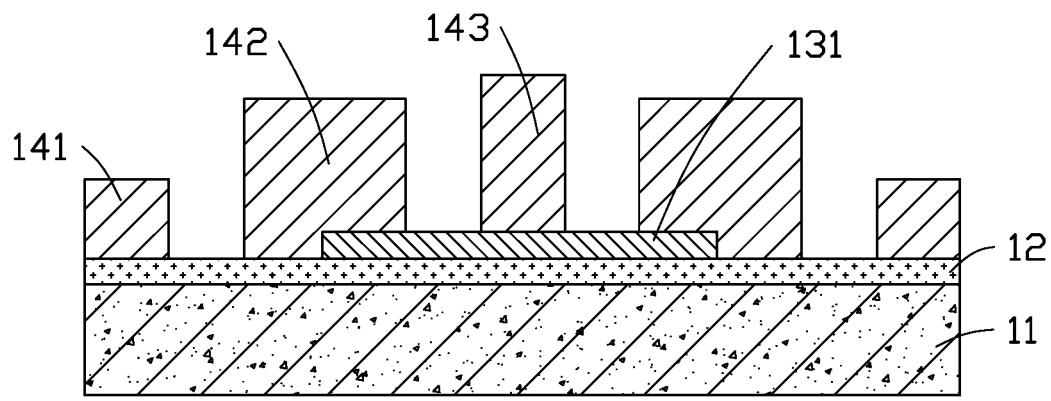
FIG. 7 is a schematic cross-sectional diagram of removing a film from the substrate shown in FIG. 6.

Referring to FIG. 7, a film removal process is performed on the substrate 10 to remove the dry film 30, so that a portion of the first metal layer 12 between the signal layer 141 and the connection pillar 142 is revealed, and a portion of the seed layer 131 between the connection pillar 142 and the coil 143 is revealed.

Figure 8:
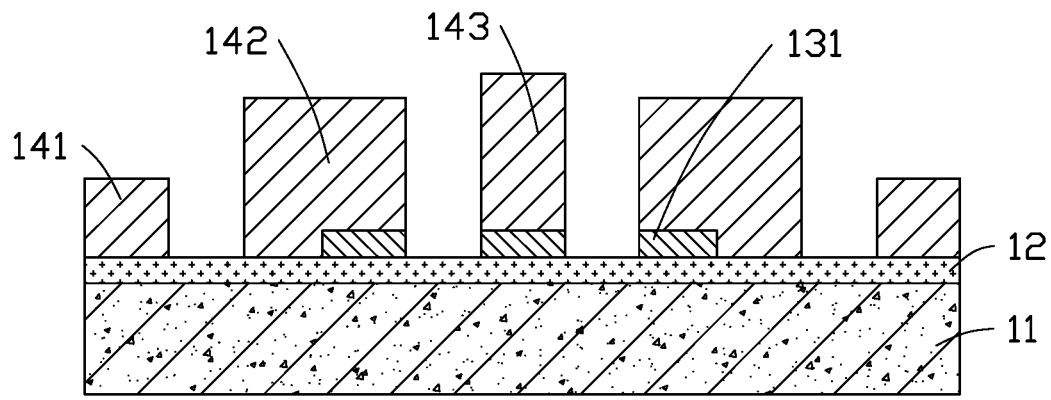
FIG. 8 is a schematic cross-sectional diagram of etching a seed layer on the substrate shown in FIG. 7.

Referring to FIG. 8, an etching process is performed on a portion of the seed layer 131 between the connection pillar 142 and the coil 143 to reveal the first metal layer 12 under the seed layer 131.

Figure 9:
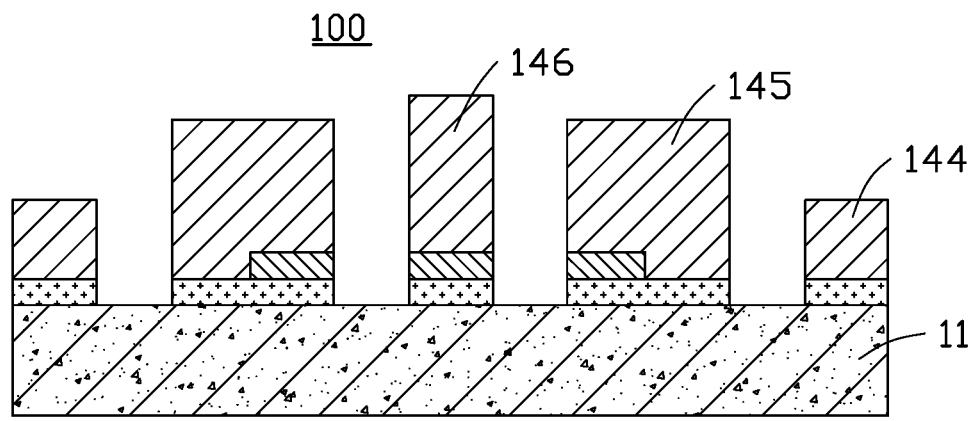
FIG. 9 is a schematic cross-sectional diagram of etching a first metal layer on the substrate shown in FIG. 8.

Referring to FIG. 9, an etching process is performed on the revealed portion of the first metal layer 12 to reveal the base layer 11, thereby forming the circuit board.

Specifically, by etching, a first circuit layer 144 is formed by the signal layer 141 and the first metal layer 12, a second circuit layer 145 is formed by the connection pillar 142, the seed layer 131, and the first metal layer 12, and a third circuit layer 146 is formed by the coil 143, the seed layer 131, and the first metal layer 12. The third circuit layer 146 may serve as a coil function area. When the circuit board is used in a micro motor, the third circuit layer 146 generates a magnetic field after being electrified to realize a driving function. The second circuit layer 145 may serve as a connection line between the third circuit layer 146 and the power source. The first circuit layer 144 may serve as a circuit layer for the power source and signal wiring.

Figure 10:
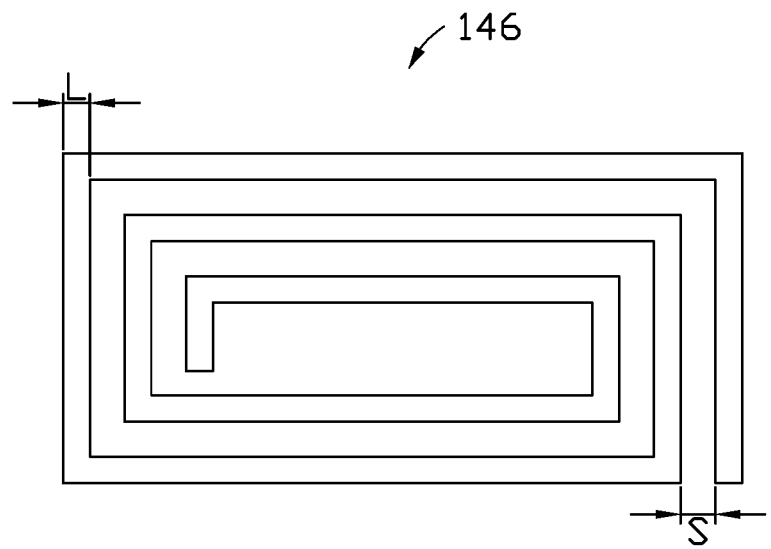
FIG. 10 is a schematic diagram of a coil of a circuit board.

Specifically, referring to FIG. 10, since the coil 143 is manufactured by the circuit board process, the line width and line spacing of the coil 143 can be designed to be thinner. Specifically, a line width L of the third circuit layer 146 formed by the coil 143 is less than or equal to 30 μm, a line pitch S is less than or equal to 20 μm, a thickness of the coil 143 is greater than 50 μm, and a total thickness of the product can be less than or equal to 0.3 mm.

It can be understood that, in some embodiments, the circuit board 100 may also be designed as a double-sided board or a multi-layer board.

In some embodiments, the steps shown in FIG. 8 and FIG. 9 can be combined, so that the portions of the first metal layer 12 between the signal layer 141 and the connection pillar 142, the portions of the seed layer 131 between the connection pillar 142 and the coil 143, and the exposed portions of the first metal layer 12 can be etched in one etching process.

FIG. 9 shows an embodiment of a circuit board 100 formed by the first embodiment of the manufacturing method. The circuit board 100 includes a substrate including a first circuit layer 144, a second circuit layer 145 coupled to the first circuit layer 144, and a third circuit layer 146 coupled to the second circuit layer 145.

The substrate 10 includes a flexible and insulating base layer 11.

The material of the base layer 11 can be selected from PI, LCP, PET, and PEN.

The first circuit layer 144 includes a first metal layer 12 formed on a surface of the base layer 11 and a signal layer 141 formed on a surface of the first metal layer 12.

The second circuit layer 145 includes a first metal layer 12 formed on a surface of the base layer 11, a seed layer 131 formed on a portion of a surface of the first metal layer 12, and a connection pillar 142 formed on a surface of the first metal layer 12 and the seed layer 131.

The third circuit layer 146 includes the first metal layer 12 formed on the surface of the base layer 11, the seed layer 131 formed on the surface of the first metal layer 12, and a coil 143 formed on a surface of the seed layer 131.

A number of the coil 143 and a number of turns of the coil 143 can be set according to actual driving requirements.

A thickness of the signal layer 141 of the first circuit layer 144 is less than a thickness of the connection pillar 142 of the second circuit layer 145, and the thickness of the connection pillar 142 of the second circuit layer 145 is less than a thickness of the coil 143 of the third circuit layer 146.

The thickness of the coil 143 is greater than 50 μm.

Materials of the first metal layer 12 and the seed layer 131 are different. A sheet resistance of the first metal layer 12 is larger than a sheet resistance of the seed layer 131.

In some embodiments, the material of the first metal layer 12 is a combination of Ni—P or NiCr oxide. The doping content of P and O and the thickness of the first metal layer 12 can be used to control the sheet resistance of the first metal layer 12. The material of the seed layer 131 may be Cu.

The first circuit layer 144 may serve as a circuit layer for a power source and signal wiring. The third circuit layer 146 may serve as a coil function area. The second circuit layer 145 may serve as a connection line between the third circuit layer 146 and the power source.

Figure 11:
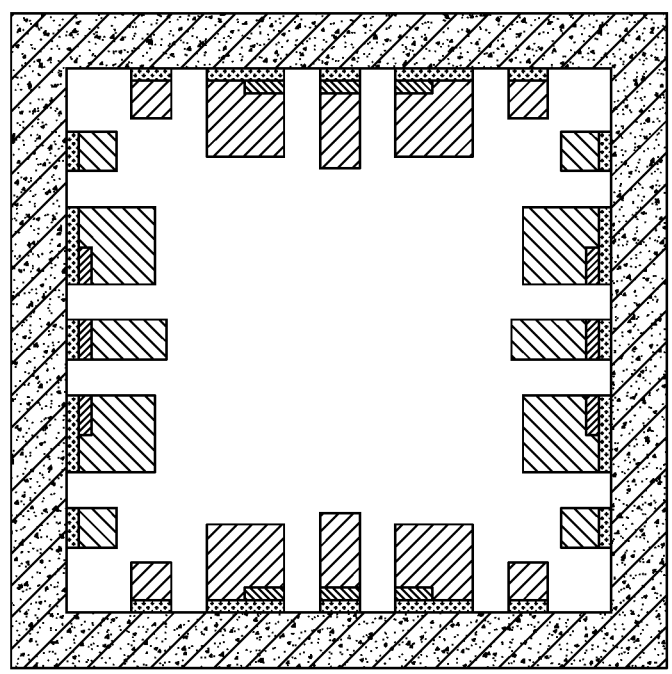
FIG. 11 is a schematic diagram of the circuit board in a folded state.

Referring to FIG. 11, the circuit board 100 can be folded at the first circuit layer 144 to form a rectangular structure including four coil function areas, and the coils 143 of the four third circuit layers 146 face each other in pairs to form a magnetic field for driving a micro motor, such as a camera. Because the coil function areas are integrally formed on the substrate of the circuit board 100, the micromotor has higher efficiency.

The coil 143 is directly formed on the substrate 10 by an electroplating process of the circuit board 100, so that the miniaturization of the coil 143 can be realized. The coil 143 and the substrate 10 are integrated and integrally formed without the need for separate production and printing of the coil 143, which improves production efficiency.

FIGS. 12-20 show a second embodiment of a manufacturing method of a circuit board including the following steps.

Figure 12:
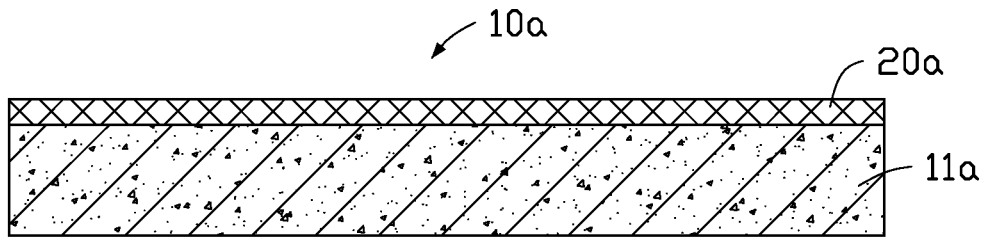
FIG. 12 is a schematic cross-sectional view of a substrate according to a second embodiment.

Referring to FIG. 12, a substrate 10a is provided. The substrate 10a includes a flexible insulating base layer 11a and a first dry film 20a covered on the base layer 11a.

The base layer 11a may be made of at least one of PI, LCP, PET, and PEN.

Figure 13:
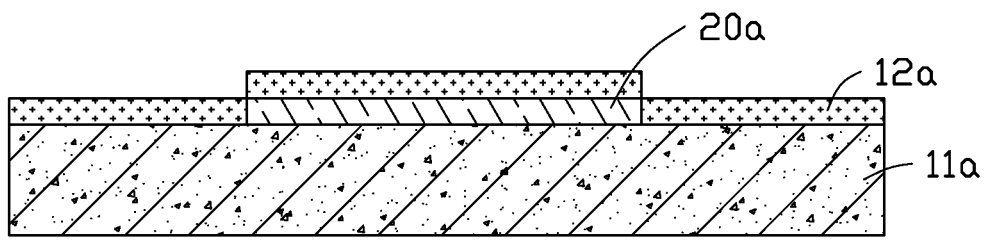
FIG. 13 is a schematic cross-sectional diagram of exposing, developing, and spraying the substrate shown in FIG. 12.

Referring to FIG. 13, the substrate 10a is exposed, developed, and sprayed to form a first metal layer 12a on the base layer 11a.

Specifically, a portion of the first dry film 20a is removed by exposure and development to reveal a portion of the base layer 11a, and then the first metal layer 12a is formed on the revealed portion of the base layer 11a and on the unexposed portion of the first dry film 20a through a spraying process.

The method of forming the first metal layer 12a is not limited to spraying. In other embodiments, the first metal layer 12a may also be formed by coating, magnetron sputtering, electroless plating, or other methods.

Figure 14:
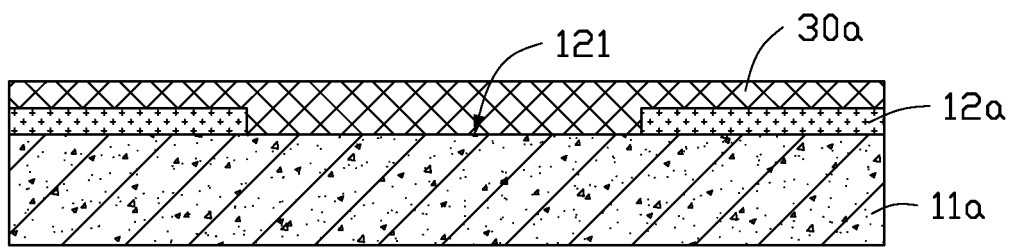
FIG. 14 is a schematic cross-sectional diagram of the substrate shown in FIG. 13 undergoing a film removal process and then being laminating.

Referring to FIG. 14, a film removal process is performed on the substrate 10a, thereby removing the first dry film 20a and defining a groove 121. Then, the substrate 10a is laminated to form a second dry film 30a on the first metal layer 12a and the base layer 11a.

Figure 15:
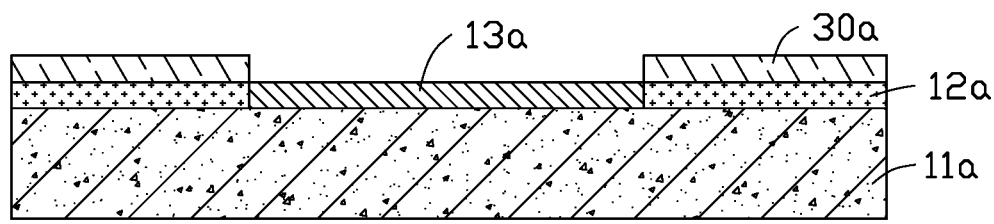
FIG. 15 is a schematic cross-sectional diagram of exposing, developing, and spraying the substrate shown in FIG. 14.

Referring to FIG. 15, the substrate 10a is exposed, developed, and sprayed to form a seed layer 13a in the groove 121.

Specifically, a portion of the second dry film 30a in the groove 121 is removed by exposure and development, and then the seed layer 13a is formed in the groove 121 by spraying.

A method of forming the seed layer 13a is not limited to spraying. In other embodiments, the seed layer 13a may be formed by coating, magnetron sputtering, electroless plating, or other methods.

Materials of the first metal layer 12a and the seed layer 13a are different. A sheet resistance of the first metal layer 12a is larger than a sheet resistance of the seed layer 13a.

In some embodiments, the material of the first metal layer 12a is a combination of Ni—P or NiCr oxide. A doping content of P and O and a thickness of the first metal layer 12a can be used to control the sheet resistance of the first metal layer 12a. The material of the seed layer 13a may be Cu. Due to the difference in sheet resistance between the first metal layer 12a and the seed layer 13a, by controlling a magnitude of a step current, a difference in electroplating efficiency can be realized on the first metal layer 12a and the seed layer 13a to realize different thicknesses of an electroplating layer.

In some embodiments, thicknesses of the first metal layer 12a and the seed layer 13a are substantially the same.

Figure 16:
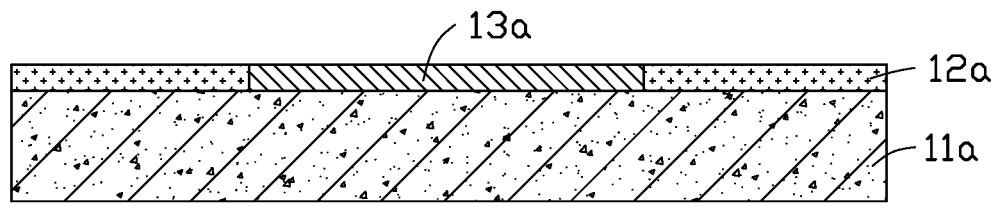
FIG. 16 is a schematic cross-sectional diagram of removing a film from the substrate shown in FIG. 15.

Referring to FIG. 16, a film removal process is performed on the substrate 10a to remove the second dry film 30a.

Figure 17:
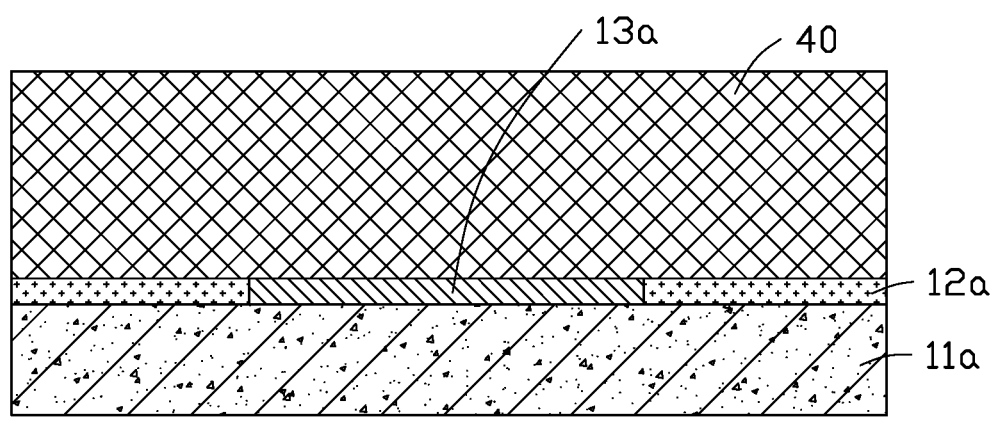
FIG. 17 is a schematic cross-sectional diagram of laminating the substrate shown in FIG. 16.

Referring to FIG. 17, the substrate 10a is laminated to cover a third dry film 40 on the first metal layer 12a and the seed layer 13a.

Figure 18:
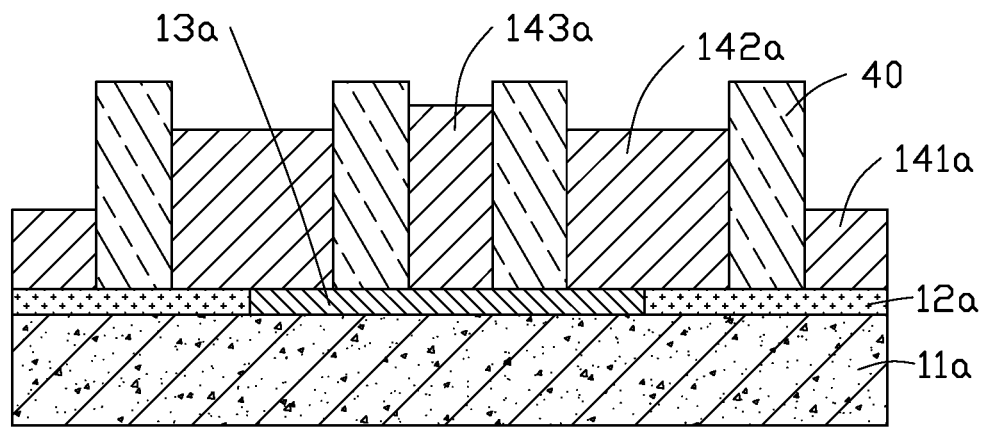
FIG. 18 is a schematic cross-sectional diagram of exposing, developing, and electroplating the substrate shown in FIG. 17.

Referring to FIG. 18, the substrate 10a is exposed, developed, and electroplated to remove a portion of the dry film 40 and separately reveal the first metal layer 12a, a portion of the first metal layer 12a and the seed layer 13a, and the seed layer 13a to form a signal layer 141a on the first metal layer 12a, a connection pillar 142a on the portion of the first metal layer 12a and the seed layer 13a, and a coil 143a on the seed layer 13a. The connection pillar 142a is located between the signal layer 141a and the coil 143a.

Specifically, due to the difference in sheet resistance between the first metal layer 12a and the seed layer 13a, different electroplating efficiencies on the first metal layer 12a and the seed layer 13a are achieved by controlling the magnitude of the step current, so that the signal layer 141a on the first metal layer 12a has the thinnest copper thickness, the coil 143a on the seed layer 13a has the thickest copper thickness, and the connection pillar 142a on the portion of the first metal layer 12a and the seed layer 13a has an intermediate copper thickness.

Figure 19:
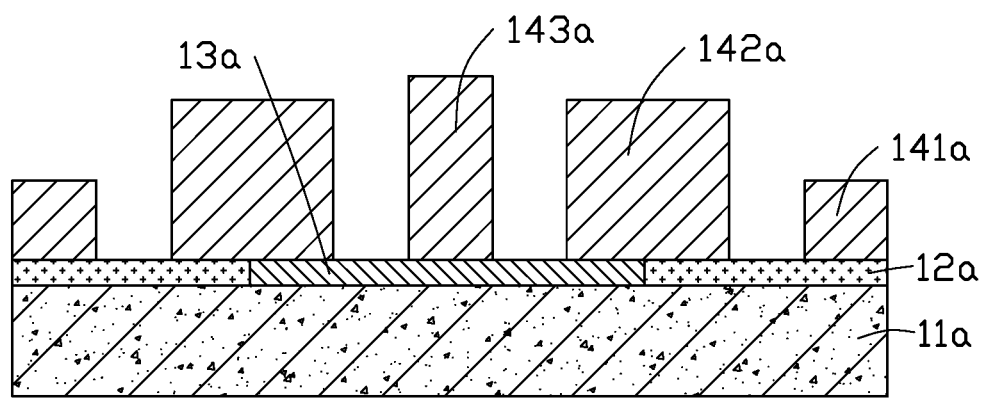
FIG. 19 is a schematic cross-sectional diagram of removing a film from the substrate shown in FIG. 18.

Referring to FIG. 19, a film removal process is performed on the substrate 10a to remove the dry film 40, so that a portion of the first metal layer 12a between the signal layer 141a and the connection pillar 142a is revealed, and a portion of the seed layer 13a between the connection pillar 142a and the coil 143a is revealed.

Figure 20:
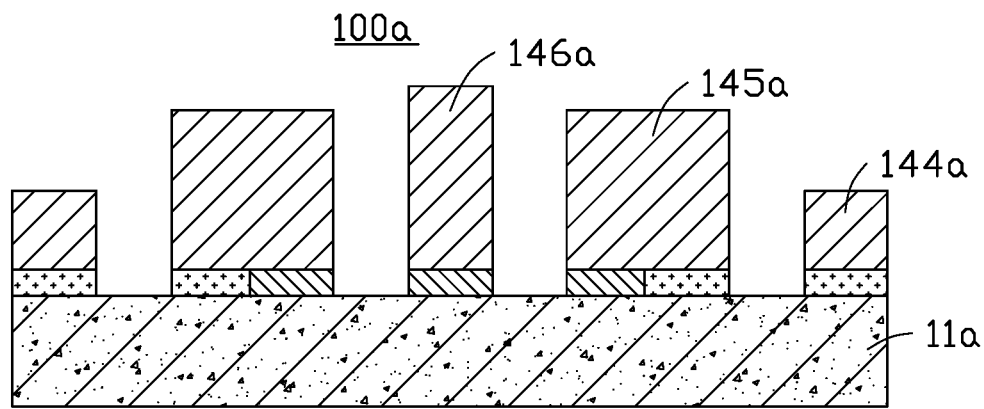
FIG. 20 is a schematic cross-sectional diagram of etching a first metal layer and a seed layer on the substrate shown in FIG. 19.

Referring to FIG. 20, a portion of the first metal layer 12a between the signal layer 141a and the connection pillar 142a and a portion of the seed layer 13a between the connection pillar 142a and the coil 143a are removed by etching, so that portions of the base layer 11a under the first metal layer 12a and the seed layer 13a are revealed, thereby forming the circuit board.

Specifically, by etching, a first circuit layer 144a is formed by the signal layer 141a and the first metal layer 12a, a second circuit layer 145a is formed by the connection pillar 142a, the seed layer 13a, and the first metal layer 12a, and a third circuit layer 146a is formed by the coil 143a and the seed layer 13a. The third circuit layer 146a may serve as a coil function area. The second circuit layer 145a may serve as a connection line between the third circuit layer 146a and a power source. The first circuit layer 144a may serve as a circuit layer for the power source and signal wiring.

It can be understood that, in some embodiments, the circuit board may be designed as a double-sided board or a multi-layer board.

FIG. 20 shows an embodiment of a circuit board 100a formed by the second embodiment of the manufacturing method. The circuit board 100a includes a substrate including a first circuit layer 144a, a second circuit layer 145a coupled to the first circuit layer 144a, and a third circuit layer 146a coupled to the second circuit layer 145a.

The substrate includes a flexible insulating base layer 11a.

The base layer 11a may be made of at least one of PI, LCP, PET, and PEN.

The first circuit layer 144a includes a first metal layer 12a formed on a surface of the base layer 11a and a signal layer 141a formed on a surface of the first metal layer 12a.

The second circuit layer 145a includes the first metal layer 12a and a seed layer 13a formed on the surface of the base layer 11a and a connection pillar 142a formed on a surface of the first metal layer 12a and the seed layer 13a.

The third circuit layer 146a includes the seed layer 13a formed on the surface of the base layer 11a and a coil 143a formed on a surface of the seed layer 13a.

A thickness of the signal layer 141a of the first circuit layer 144a is less than a thickness of the connection pillar 142a of the second circuit layer 145a, and the thickness of the connection pillar 142a of the second circuit layer 145a is less than a thickness of the coil 143a of the third circuit layer 146a.

The thickness of the coil 143a is greater than 50 μm.

Materials of the first metal layer 12a and the seed layer 13a are different. A sheet resistance of the first metal layer 12a is larger than a sheet resistance of the seed layer 13a.

In some embodiments, the material of the first metal layer 12a is a combination of Ni—P or NiCr oxide. A doping content of P and O and the thickness of the first metal layer 12a can be used to control the sheet resistance of the first metal layer 12a. The material of the seed layer 13a may be Cu.

The first circuit layer 144a may serve as a circuit layer for a power source and signal wiring. The third circuit layer 146a may serve as a coil function area. The second circuit layer 145a may serve as a connection line between the third circuit layer 146a and the power source.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A circuit board comprising:
    a substrate comprising a base layer, a first metal layer formed on the base layer, and a seed layer formed on the first metal layer;
    a first circuit layer located on the substrate and comprising the first metal layer and a signal layer formed on a surface of the first metal layer;
    a second circuit layer coupled to the first circuit layer and comprising the first metal layer, the seed layer, and a connection pillar formed on a surface of the first metal layer and the seed layer; and
    a third circuit layer coupled to the second circuit layer and comprising the seed layer and a coil formed on a surface of the seed layer.

2. The circuit board of claim 1, wherein:
the seed layer is formed on a surface of the first metal layer.

3. The circuit board of claim 1, wherein:
a sheet resistance of the first metal layer is greater than a sheet resistance of the seed layer.

4. The circuit board of claim 1, wherein:
the circuit board is folded at the first circuit layer to form a rectangular structure comprising four coils, the four coils facing each other in pairs.

5. The circuit board of claim 1, wherein:
a material of the base layer is selected from at least one of polyimide, liquid crystal polymer, polyethylene terephthalate, and polyethylene naphthalate.

6. The circuit board of claim 1, wherein:
a material of the first metal layer is a combination of Ni—P or NiCr oxide; and
a material of the second metal layer is Cu.

* * * * *